United States Patent
Kamarehi

(10) Patent No.: US 7,183,514 B2
(45) Date of Patent: Feb. 27, 2007

(54) HELIX COUPLED REMOTE PLASMA SOURCE

(75) Inventor: Mohammad Kamarehi, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 156 days.

(21) Appl. No.: 10/766,973

(22) Filed: Jan. 29, 2004

(65) Prior Publication Data

US 2004/0182834 A1 Sep. 23, 2004

Related U.S. Application Data

(60) Provisional application No. 60/444,612, filed on Jan. 30, 2003.

(51) Int. Cl.
*B23K 10/00* (2006.01)

(52) U.S. Cl. ............... 219/121.43; 219/121.41; 219/121.48; 219/748; 118/723 MW; 315/111.21

(58) Field of Classification Search ............... 219/745, 219/757, 761, 121.4, 121.43, 121.41, 121.48; 315/111.21, 111.81, 111.51; 118/723 MW
See application file for complete search history.

(56) References Cited

U.S. PATENT DOCUMENTS

| | | | |
|---|---|---|---|
| 4,494,039 A | 1/1985 | Kim | |
| 5,321,222 A * | 6/1994 | Bible et al. | 219/745 |
| 5,412,684 A | 5/1995 | Schlie et al. | |
| 5,534,231 A | 7/1996 | Savas | |
| 5,811,022 A | 9/1998 | Savas | |
| 5,841,237 A * | 11/1998 | Alton | 315/111.81 |
| 5,841,243 A | 11/1998 | Hooper | |
| 5,841,244 A | 11/1998 | Hamilton et al. | |
| 5,964,949 A | 10/1999 | Savas | |
| 5,983,828 A | 11/1999 | Savas | |
| 6,208,095 B1 | 3/2001 | DiVergilio et al. | |
| 6,225,745 B1 | 5/2001 | Srivastava | |
| 6,263,830 B1 | 7/2001 | Kamarehi et al. | |

FOREIGN PATENT DOCUMENTS

EP  0 507 885 B1  3/1997

OTHER PUBLICATIONS

Liao, S. Y., Microwave Devices and Circuits, Prentice-Hall, Inc., Second Ed., Englewood Cliffs, New Jersey; pp. 150-154 and pp. 220-224.

* cited by examiner

*Primary Examiner*—Mark Paschall
(74) *Attorney, Agent, or Firm*—Knobbe Martens Olson & Bear

(57) ABSTRACT

A remote plasma source employs a helical coil slow wave structure to couple microwave energy to a flowing gas to produce plasma for downstream substrate processing, such as photoresist stripping, ashing, or etching. The system also includes cooling structures for removing excess heat from the plasma source components.

28 Claims, 5 Drawing Sheets

HELIX COUPLED REMOTE PLASMA SOURCE

CROSS-REFERENCE TO RELATED APPLICATIONS

This Application claims the benefit of U.S. Provisional Patent Application Ser. No. 60/444,612, filed Jan. 30, 2003, the entire contents of which are incorporated herein by reference.

FIELD OF THE INVENTION

The present invention relates to remote plasma sources for use in semiconductor manufacturing processes such as photoresist ashing and etching processes.

BACKGROUND OF THE INVENTION

Description of the Related Art

In semiconductor processing, remote plasma generators are often employed upstream of a processing chamber such as an asher employed for burning off photoresist after lithography steps. Such remote plasma generators have been provided in a variety of configurations. In general, energy is coupled to a gas flowing through a plasma tube in order to create a plasma. Plasma products continue to flow downstream through the plasma tube, into a process chamber, and ultimately impinge on a workpiece.

One common method of coupling energy to a flowing gas is known as inductively-coupled-plasma (ICP) generation. An ICP reactor typically couples electrical energy to a flowing gas by induction (and to some extent by capacitance) from an electrical conductor, often in the shape of a coil, surrounding a plasma reactor chamber. The electromagnetic field created within the chamber by the electric current flowing through the conductor is repeatedly reversed by alternating the electric current at high frequencies, thereby coupling substantial energy to the gas molecules flowing through the chamber. See, e.g., U.S. Pat. No. 5,964,949.

Another common method of coupling energy to a flowing gas, which is more complex but generally less expensive, is by applying microwave energy to a flowing gas. One such configuration employs a magnetron generator that propagates microwave energy along a waveguide. In this configuration, the waveguide is arranged to create a standing wave which peaks in a portion of a gas tube passing through the waveguide. Coupling sufficient microwave energy to the gas causes a plasma to ignite. For this reason, the portion of the tube in which energy is coupled to the flowing gas is often referred to as a plasma applicator.

One of the difficulties with such conventional plasma generators is that the standing wave is established and maintained by tuning, such as by gross tuning at the end of the waveguide and fine-tuning dynamically with one or more tuning stubs within the waveguide. However, the mass flow rate of the plasma and the amount of energy coupled to the plasma can change during processing, and from recipe to recipe. Such changes make it difficult to maintain the standing wave and therefore the transfer efficiency of energy to the plasma suffers, resulting in increased energy costs and inconsistent processing effect. Therefore, it is desirable to provide a microwave plasma generator that does not suffer from the difficulties associated with tuning a standing wave.

SUMMARY

The need for dynamic tuning of a microwave signal during processing can be substantially reduced or eliminated by placing the plasma tube in the path of a travelling wave rather than a standing wave. One category of travelling wave structures includes "slow-wave" structures, which have particular advantages in applications where it is desirable to reduce the phase velocity of a microwave in a particular direction.

Slow-wave structures or periodic structures are microwave devices that are commonly used in conventional vacuum tubes, such as traveling-wave and magnetron-type tubes, to reduce microwave signal velocity in the direction of wave propagation so that the gas travelling in the space and the signal wave can interact. The phase velocity of a propagating electromagnetic wave (i.e. transverse electromagnetic or "TEM") in ordinary microwave waveguides is greater than the velocity of light. The phase velocity of a propagating TEM wave in free space or in a vacuum is less than the velocity of light. In the operation of traveling-wave tube ("TWT") and magnetron-type devices which are used to amplify and oscillate small signals to much stronger signals, the velocity of the electron cloud must be comparable to the phase velocity of the microwave signal for an effective transfer of the electron energy to the microwave signal. Since the electron velocity can be accelerated only to velocities that are slightly slower than the speed of light, a slow-wave structure is typically incorporated into the TWT and magnetron-type devices to bring the phase velocity of the microwave signal close to the velocity of the electron beam for effective interaction.

A wire wound in the form of helix is one type of periodic slow-wave structure and is commonly used as a slow-wave device in the construction of traveling wave tubes (see, e.g., Microwave Devices and Circuits, Samuel Y. Liao, page 477, FIG. 9.20, O-type traveling-wave tube). The phase velocity of a wave travelling through the helix, $v_p$, is approximately given by $C \sin \Psi$, where C is the velocity of light and $\Psi$ is the pitch angle of the helix. Since the value of $\sin \Psi$ is less than 1, the phase velocity of the microwave signal propagating along the axial direction of the helix is less than the speed of light, thus making the microwave signal suitable for interaction with the electron beam generated in the TWT by DC electrodes.

In a conventional vacuum tube, a helical structure can be incorporated in an electron beam in direct contact with the plasma flux. The injected signal traveling on the helix towards the output typically extracts energy from the electron beam and is amplified as it exits the helix. In the preferred embodiments described below, this principle is applied in reverse, i.e., the high-power microwave energy is delivered to the helix and is then transferred to the gases in the plasma vessel as the microwave energy propagates along the helical structure. Thus, as sufficient microwave energy is transferred to the gases, a plasma is created in the plasma vessel.

According to some embodiments, a helical slow-wave structure can be used to launch and deliver microwave energy as a propagating wave, preferably at 2,450+/−50 MHz, to generate plasma for downstream photoresist removal and etch applications.

In one embodiment, a remote plasma generator is provided, comprising a microwave power source, a microwave energy waveguide communicating with the power source, and a plasma chamber configured to be mounted in fluid communication with a source of the gases and a processing chamber. A helical coil surrounds the plasma chamber, and a waveguide coupler couples the microwave energy from the waveguide to the helical coil.

According to another embodiment, a method of delivering products of a plasma to a processing chamber is provided. The method comprises providing a source of process gases in fluid communication with a plasma tube which is in fluid communication with the process chamber. A microwave signal is then generated and propagated along a microwave conducting structure having a portion in the shape of a helix surrounding the plasma tube. A gas is then flowed through the plasma tube such that a plasma is ignited in the gas within the plasma tube, and the plasma products are ultimately delivered to the process chamber.

Still another embodiment provides a method of removing a layer from a substrate. The method comprises flowing plasma source gases through a plasma reactor tube, propagating microwave energy in a travelling wave along a microwave conducting structure having a shape of a slow wave structure and surrounding the plasma reactor tube. A plasma is ignited within the plasma reactor tube by the microwave energy, and the plasma products continue to flow to a process chamber where they impinge on a substrate in order to remove the layer from the substrate. In further embodiments, the reactor tube can be cooled by flowing a fluid through a conduit adjacent the reactor tube. The conduit can comprise a hollow center of the slow wave structure material, a cooling jacket, or a space between a microwave shield and the reactor tube.

DETAILED DESCRIPTION OF THE PREFERRED EMBODIMENTS

The embodiments below generally describe remote plasma sources for use in semiconductor processing including ashing, etching and stripping steps. The remote plasma sources described herein generally employ a slow wave structure in the form of a helical coil to couple microwave energy to a gas flowing through a plasma tube.

Figure 1:
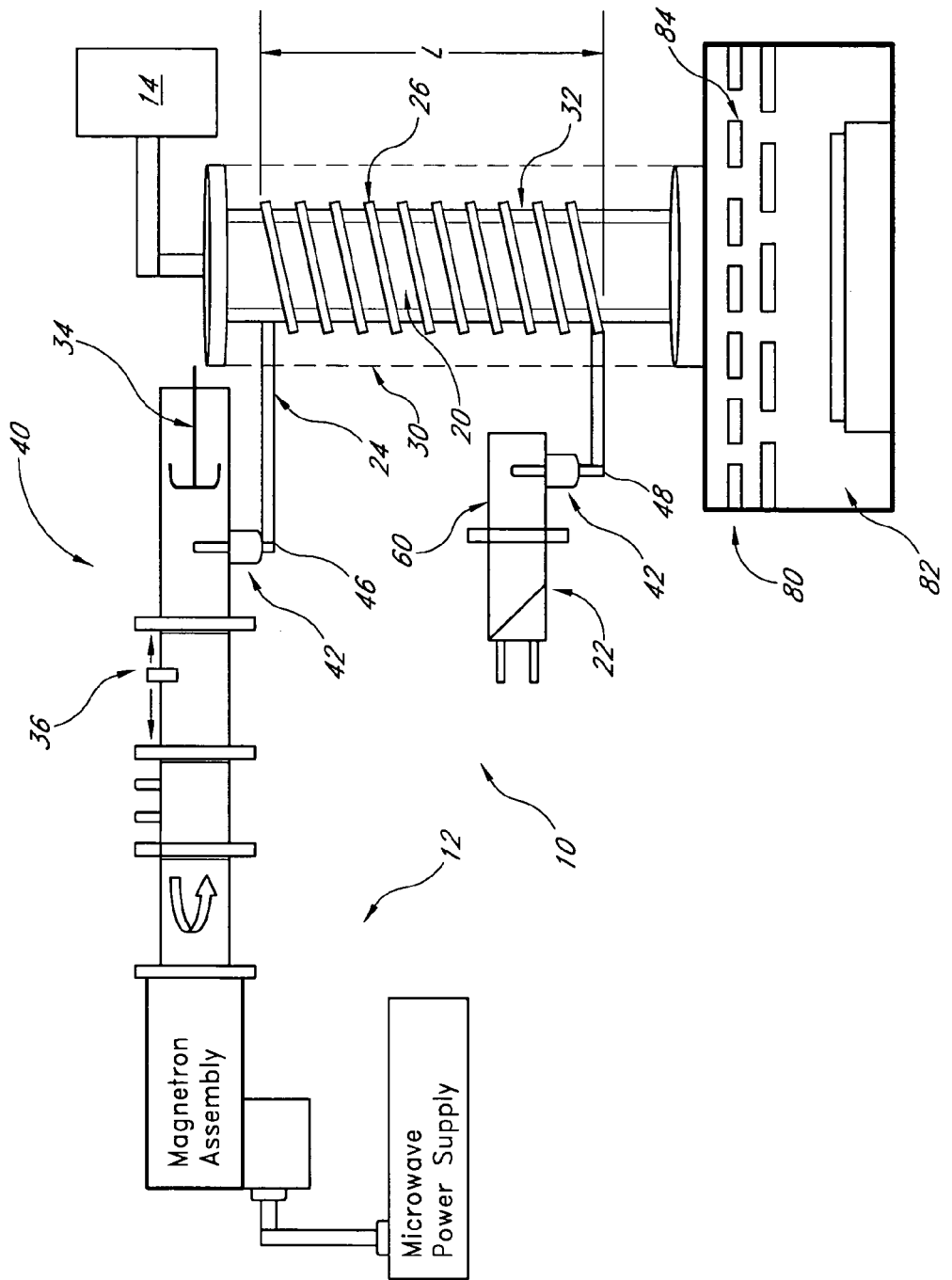
FIG. 1 is a schematic illustration of one embodiment of a plasma generator having features in accordance with the present invention.
Figure 2:
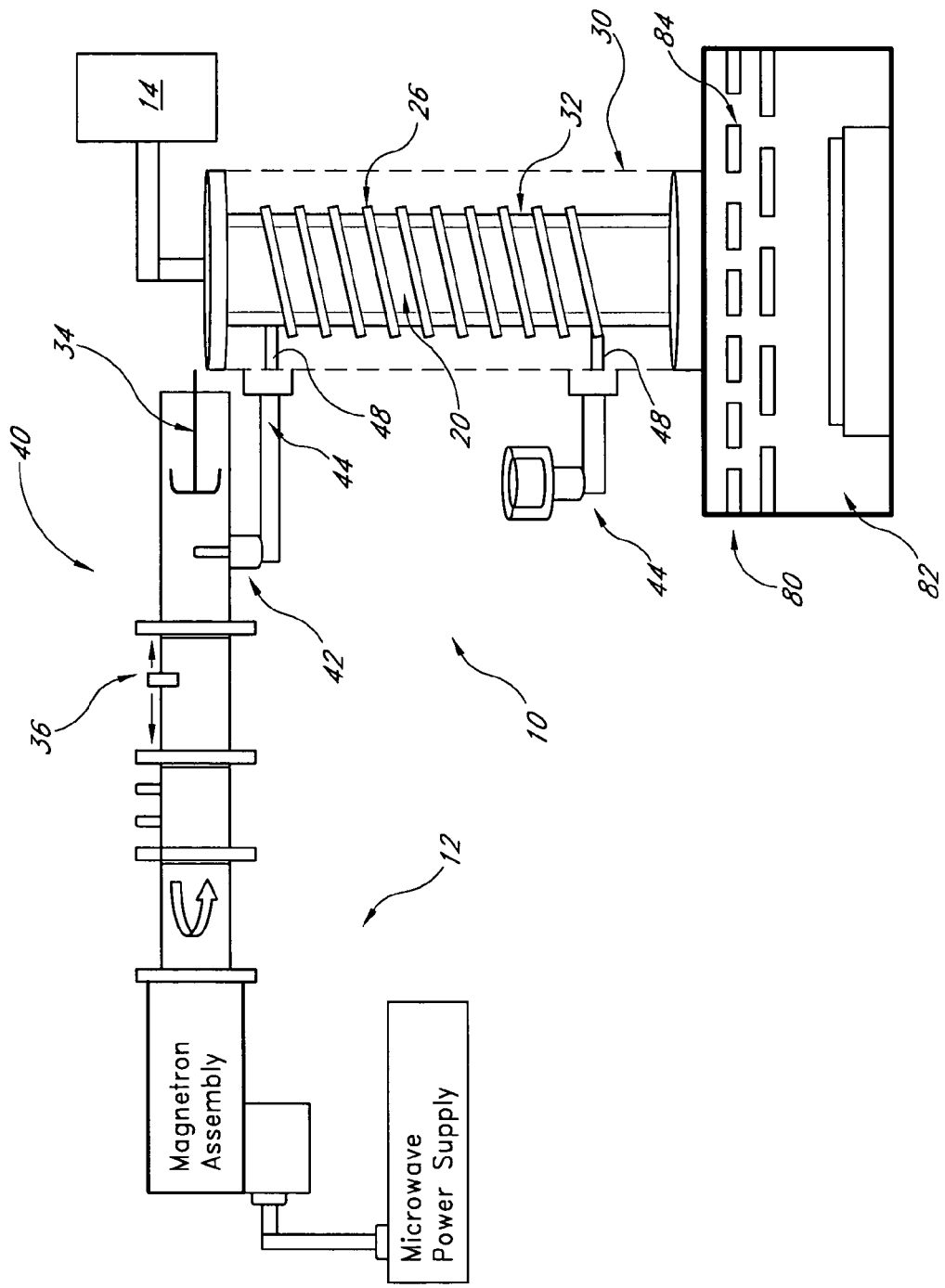
FIG. 2 is a schematic representation of another embodiment of a plasma generator having features in accordance with the present invention.

FIGS. 1 and 2 schematically illustrate embodiments of a plasma source (or plasma generator) 10 having features of the present invention. In one embodiment, the plasma source 10 generally comprises microwave generation and tuning structures 12, a source of gases 14, a plasma tube 20 and a microwave absorption load 22. As shown, the plasma tube 20 is surrounded by a microwave conducting structure 24 with a central portion formed in the shape of a helical coil 26. In one preferred embodiment, the helical coil 26 and plasma tube 20 are enclosed within a microwave shield 30 which can be made up of a metallic sheet or mesh configured to be opaque to microwave energy. Some embodiments also include a cooling jacket 32 between the helical coil 26 and the plasma tube 20. The cooling jacket 32 is generally configured to remove excess heat from the system components.

Additionally, the system can include a microwave trap located between the coil 26 and the process chamber in order to limit the transmission of microwave energy into the reaction chamber. Many embodiments of such traps are available, for example, U.S. Pat. No. 5,498,308 to Kamarehi, entitled "Plasma Asher with Microwave Trap," describes a resonant circuit trap.

The microwave source can comprise any generator recognized as suitable for creating microwave energy of the desired power level, such as a magnetron or a travelling wave tube type generator. In some embodiments, it may be desirable to provide microwave tuning structures. In the plasma generator embodiments illustrated schematically in FIGS. 1 & 2, sliding shorts 34 and tuning stubs 36 are provided to vary the wavelength of the microwave signal in order to optimize the coupling of the microwave power to the microwave conducting structure 24. In further embodiments, other tuning structures can also be used, such as a multiple stub tuner, and in still further embodiments the apparatus can be optimized during design so as to avoid dynamically tuning the microwave signal during processing. In contrast to conventional plasma generators, a standing wave is not maintained in the waveguide 40 of the illustrated system, such that dynamic tuning is not as critical as it is for conventional microwave plasma systems. Additionally, because the plasma tube 20 does not pass through the microwave waveguide 40, the plasma generator is relatively insensitive to changes in the process recipe, such as changes in the flow rate of gas/plasma through the process tube 20.

The microwave conducting structure 24 is typically a metallic material selected to direct the microwave energy along its length. In one embodiment, the microwave conducting structure 24 comprises a section of copper tubing formed in the shape of a helix 26. The helix 26 can be formed such that its longitudinal axis is concentric with the cylindrical plasma tube 20. In alternative embodiments, the helix can be formed such that its center is not coaxial with tube 20. Additionally, the microwave conducting structure can be solid or can comprise other materials such as aluminum, steel, or other metals or composites capable of propagating an electromagnetic wave in the microwave region. The microwave conducting structure 24 can also comprise a material of any suitable solid or hollow-centered cross-sectional shape, such as circular, rectangular, elliptical, etc. As the microwave current flows along the helical wire 26, an electromagnetic field is created within the plasma tube 20 to couple energy to the gases flowing through the tube 20.

In some preferred embodiments, the helical section 26 of the microwave conducting structure 24 preferably has a length 'L' measured along the plasma tube axis of between about 0.5 and 10 inches. The length 'L' of the helix 26 can be varied depending on the level of microwave powers to be coupled to the flowing gases. For lower applied microwave power, a shorter helix can be used, while a higher applied microwave power typically calls for a longer helix in order for an the same proportion of energy to be absorbed by the gas in the plasma tube. Similarly, the internal diameter of the helix 26 and the material cross-section can be varied according to factors such as the amount of power to be transmitted.

In one preferred embodiment, the helix 26 has a length 'L' of about 1.6 inches, an inside coil diameter of about 1 inch, and an outside coil diameter of about 1.25 inches (i.e., the conducting material is about 0.25" thick). In one preferred embodiment, the helix includes 7 turns such that each turn is spaced an axial distance of about 0.23 inches from each adjacent turn. The microwave conducting structure material can be in direct physical contact with the outer surface of the cooling jacket 32 or the plasma tube 20 if so desired.

Figure 6:
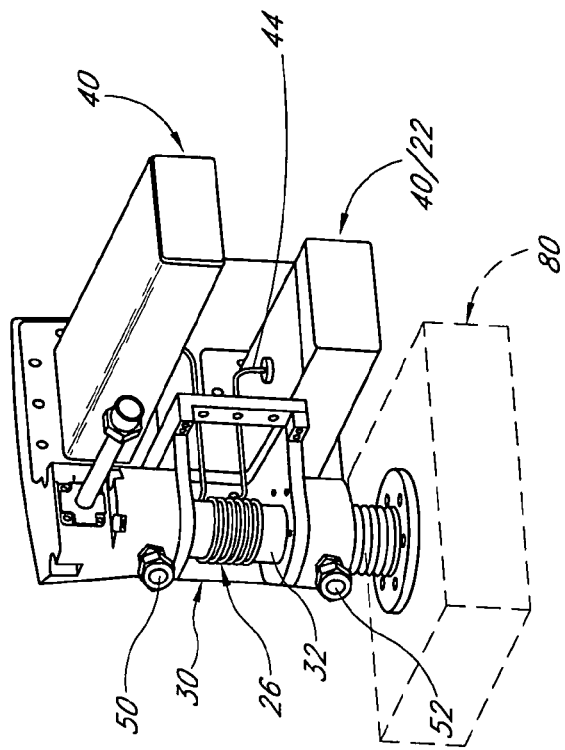
FIG. 6 is schematic perspective illustration of an embodiment of a plasma generator employing coaxial cable connections.

The microwave conducting structure 24 is coupled to the microwave waveguide 40 by a waveguide antenna coupler 42. Alternatively (or in addition), in some embodiments such as low power applications (e.g., less than about 1,000 Watts), coaxial cables and connectors 44, as shown in FIGS. 2 and 6, can be used as part of the waveguide couplers 42 to the microwave conducting structure 24. Other methods of coupling the microwave energy to the helical coil 26 can also be used.

Since the plasma generator preferably employs a travelling wave, the microwave conducting structure 24 can be described as having an input end 46 and an output end 48. At the output end 48, the microwave conducting structure 24 can be coupled to a microwave load 22 configured to absorb the remaining microwave energy leaving the plasma source 10. The microwave conducting structure 24 can be coupled to the microwave load 22 by a waveguide coupler 42 (FIGS. 1, 3 and 5), coaxial cable transitions 44 (FIGS. 2 and 6), or other suitable microwave coupling devices.

The microwave load 22 can include any structure suitable for dissipating or re-using the microwave energy leaving the coiled portion 26 of the microwave conducting structure 24. For example, in one embodiment, the microwave absorption load comprises a water-cooled ceramic structure. Alternatively, some excess microwave energy can be fed back to the microwave generation and amplification structures to be returned to the plasma generator 10.

The plasma tube 20 can comprise a number of suitable materials, but is typically quartz, ceramic or sapphire. Embodiments of plasma generators 10 described herein can include plasma tubes 20 with total lengths between about a half an inch (i.e. about 12 mm) and about 10 inches (i.e. about 254 mm). The tube length can be varied according to the desired process parameters, such as the length of the coil, the quantity of power to be applied, or the desired process performance. In one preferred embodiment, the plasma tube 20 has a length of about 7 inches. Of course, in further embodiments, dimensions outside of these ranges could also be used as desired.

Figure 3:
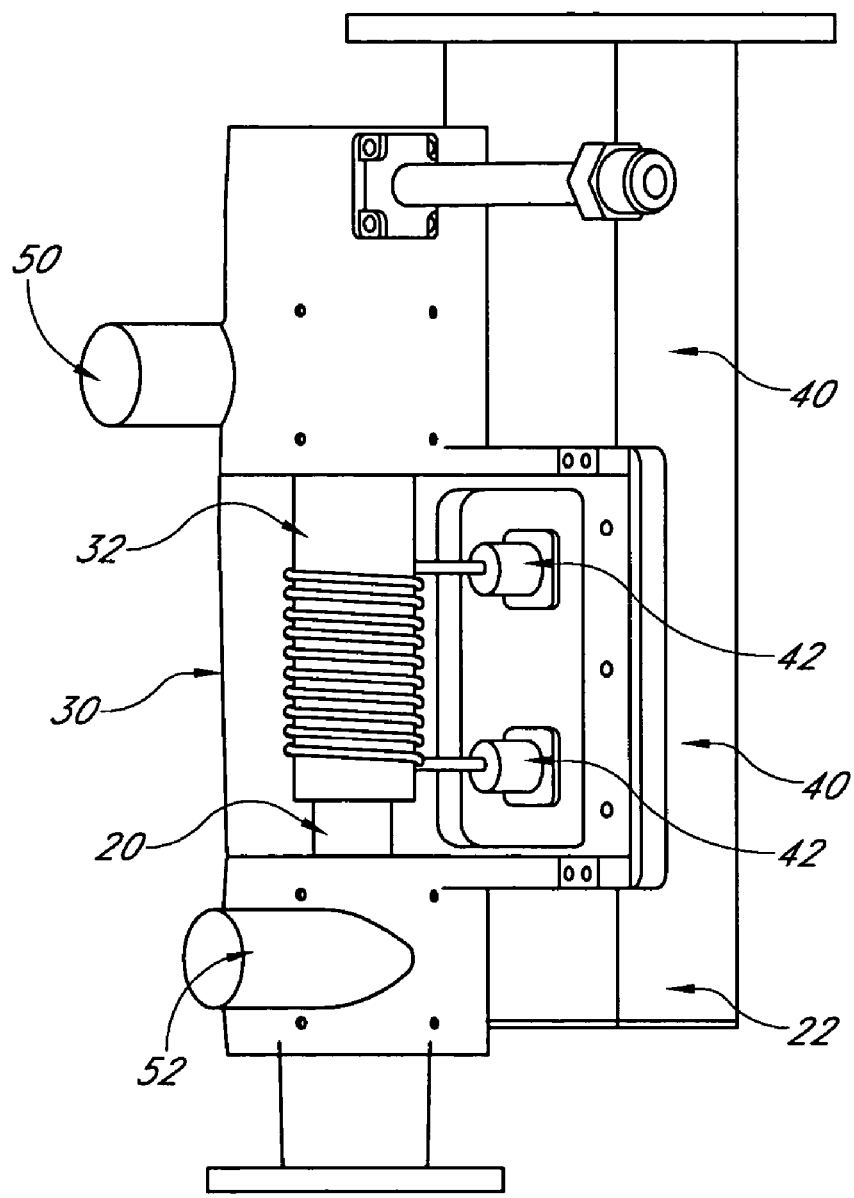
FIG. 3 is a schematic, partially cut-away perspective illustration of an embodiment of a plasma generator having features in accordance with the present invention.
Figure 5:
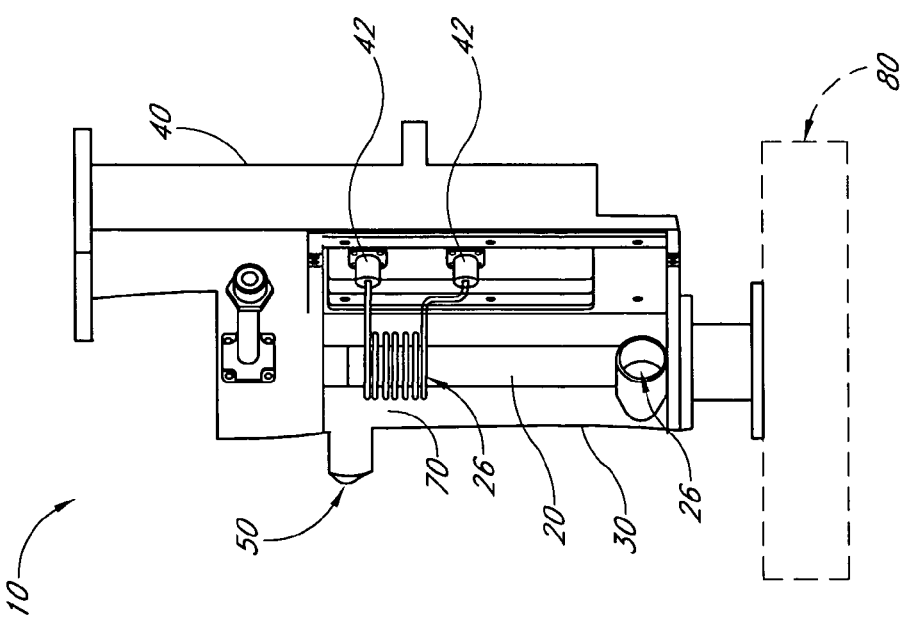
FIG. 5 is a schematic perspective illustration of an embodiment of a plasma generator that is configured to be air-cooled.

In order to control the temperature of the plasma tube 20 and other system components, a cooling jacket 32 can be provided to enclose the sections of the plasma tube 20 which will be exposed to the high-temperature plasma products. The cooling jacket 32 typically comprises an annular space through which a cooling fluid can circulate between the cooling jacket wall and the plasma tube 20. As shown in FIGS. 3, 5 and 6, the cooling jacket 32 generally includes a fluid inlet 50 connected to a fluid source (not shown) and a fluid outlet 52 in communication with a heat exchanger (not shown) for dissipating the heat absorbed by the cooling fluid. The cooling fluid can be moved through the cooling jacket 32 and the other cooling system components in an open or closed loop by any suitable pump (not shown) as will be clear to the skilled artisan. The cooling jacket 32 can be arranged in a "counter flow" arrangement wherein a cooling liquid is circulated through the cooling jacket 32 with a flow in a direction that is generally opposite to the flow direction of the hot plasma. Alternatively, the cooling fluid can be circulated through the cooling jacket 32 in a "parallel flow" or other arrangement as desired.

The cooling jacket 32 is preferably made of a material that is substantially transparent to microwave energy. According to one embodiment, the cooling jacket 32 can be made of the same material or a similar material to the plasma tube 20 (e.g. quartz, ceramic or sapphire). In such embodiments, the cooling fluid can be selected to be substantially transparent to microwave energy, thereby limiting the degree to which the microwave energy heats up the cooling fluid directly.

In some embodiments, such as some high power applications, a cooling jacket, such as those described above, can be supplemented or replaced by a microwave conducting structure 24 formed of hollow tubing through which a cooling fluid can be circulated. Since the microwave energy travels on the outer surface of the microwave conducting structure 24 and only travels into the microwave conducting material to a depth on the order of $10^{-4}$ inches (the skin depth), a fluid travelling through the microwave conducting structure 24 will be substantially unaffected by the microwave radiation.

Figure 4:
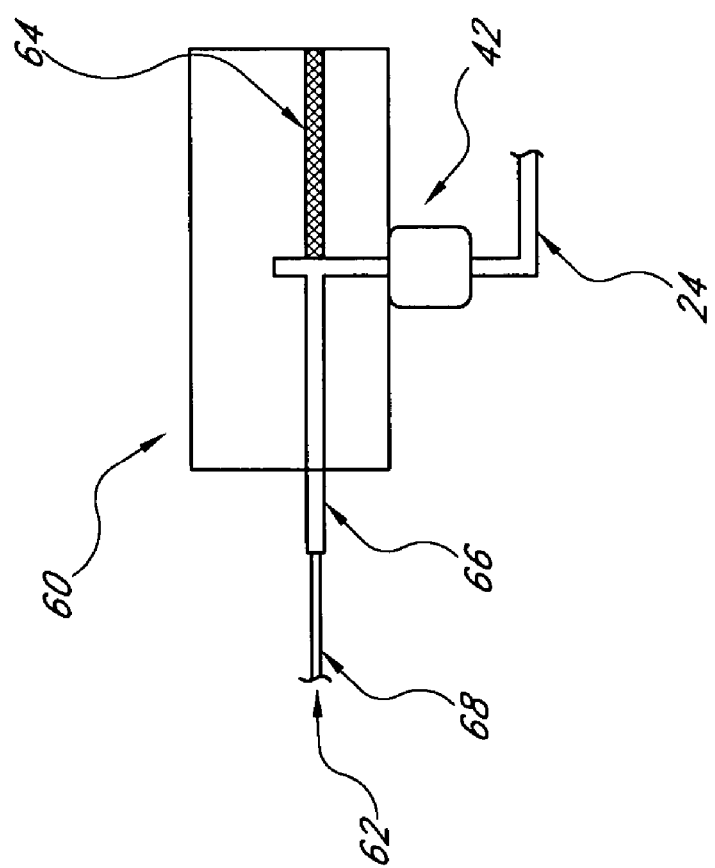
FIG. 4 is a schematic illustration of a cross-bar termination of the plasma generator of FIGS. 1 and 2.

As illustrated in FIG. 4, a modified cross-bar termination 60 can be provided adjacent the junctions between the ends of the microwave conducting structure 24 and the waveguide couplers 42. The modified cross-bar termination 60 is configured to couple the energy signals from the waveguide coupler 42 to the microwave conducting structure 24 (and vice versa) and to couple the internal cooling channel to the cooling fluid flow path 62 while preventing the cooling fluid from being directly exposed to the microwave energy signals. This is generally accomplished by providing the cross-bar termination 60 with a solid microwave conductor 64 exiting the termination in one direction and a fluid outlet 66 exiting the termination 60 in the opposite direction. The fluid outlet 66 can comprise a non-conductive section 68 in order to prevent the microwave energy from propagating along the fluid flow path 62.

In another embodiment as illustrated in FIG. 5, for example, the plasma source 10 can be air-cooled by circulating air (or another cooling gas) through the space 70 between the microwave shield 30 and the plasma tube 20. According to such an embodiment, the cooling jacket 32 (FIGS. 1, 3 and 6) could be omitted if so desired.

The flow rate of fluid through cooling system (i.e., the cooling jacket, the hollow microwave conducting material, or the air space within the microwave shield) will generally depend on numerous factors such as the rate of heat transfer desired, the size of the fluid pathway, the contact area between the components of the cooling system, and others. The skilled artisan will understand how to appropriately configure the cooling system in order to keep the system components within acceptable temperature ranges.

With continued reference to FIGS. 1–6, the methods of operation of a plasma generator 10 having features and advantages of the present invention will now be described. According to one embodiment, microwave energy produced by a magnetron assembly (or other suitable microwave generation device) is fed to a waveguide 40 and then propagated along the microwave conducting structure 24, including the helical coil section 26 which surrounds the cooling jacket 32 (if present) and the plasma tube 20. As the microwave energy propagates along the helical coil 26, substantial amounts of energy are transferred and coupled to gases flowing from the gas source 14 through the plasma tube 20. Energy is coupled to the flowing gases by direct excitation of the gas molecules by the microwave signal propagating along the helix and the plasma tube space. The plasma products continue to flow through the plasma tube 20 and into the process chamber 80 for processing a workpiece supported on a substrate support 82 therein. Baffle plates 84 can also be provided to shield the workpiece from the ultraviolet radiation discharged from the plasma source and to uniformly distribute the plasma products throughout the process chamber. The remaining microwave energy continues to propagate along the coil 26 and is absorbed by the microwave load 22.

In some embodiments of the present invention, a helical slow-wave structure is used to launch and deliver microwave energy as a propagating wave, preferably at 2,450+/−50 MHz and a wavelength of about 4.8 inches, in order to generate plasma for downstream applications such as photoresist removal and etching. In this frequency band, the helix can provide many features and benefits for these applications. Since the helix supports propagation of the microwave energy, evenly distributed plasma is formed in the plasma tube. In some embodiments, a plasma source 10 with a helical slow wave structure can be operated with an applied power of up to about 3 kW. In one preferred embodiment, the source is operated with a microwave signal having a power of about 1300 to 1500 W.

Since the helix is a traveling wave structure as opposed to a resonant one, the microwave coupling to the plasma gas is not as sensitive or dependent upon the changes that are made to the state of the plasma load condition. This eliminates the need for in situ or manual impedance tuning for maximum power delivery and coupling, which is a significant and important advantage for photoresist removal and etch applications, where process parameters such as pressure, flow rate, power and gas type are varied to optimize process conditions.

Evenly distributed plasmas help to prevent a sapphire tube from cracking. Sapphire tubes, which are often used as plasma vessels in applications which call for fluorinated chemistries, are susceptible to failure when exposed to uneven thermal distribution and thermal shock. Thus, another advantage of the helical source is the distributed and uniform pattern which reduces local thermal gradients and simplifies cooling.

In an experiment, a plasma source including a quartz plasma tube, a helix having 7 turns, a 1-inch inner diameter and a length 'L' (FIG. 1) of about 5" was assembled. The helix was coupled to a microwave source using high power coaxial cable couplings, and a microwave signal at 1,300 Watts and 2,450 Hz, was propagated along the helix. $O_2$ and $N_2$ were flowed through the plasma tube at 6,000 sccm and into a process chamber maintained at 1.5 Torr in which a wafer with a photoresist layer was supported. The process resulted in an ash rate of 5.9 µm/min. This experiment successfully demonstrated the operability of creating a plasma by coupling microwave power to a gas using a slow wave structure such as a helical coil.

Although certain embodiments and examples have been described herein, it will be understood by those skilled in the art that many aspects of the methods and devices shown and described in the present disclosure may be differently combined and/or modified to form still further embodiments. For example, in further embodiments, other slow-wave structures can be used in place of a helical coil. Additionally, it will be recognized that the methods described herein may be practiced using any device suitable for performing the recited steps. Such alternative embodiments and/or uses of the methods and devices described above and obvious modifications and equivalents thereof are intended to be within the scope of the present disclosure. Thus, it is intended that the scope of the present invention should not be limited by the particular embodiments described above, but should be determined only by a fair reading of the claims that follow.

I claim:
1. A remote plasma generator, comprising:
   a microwave power source;
   a microwave energy waveguide communicating with the power source, and configured to produce a travelling wave;
   a plasma chamber configured to be mounted in fluid communication between a source of gases and a semiconductor substrate processing chamber;
   a helical coil surrounding the plasma chamber; and
   a coupler coupling the microwave energy from the waveguide to the helical coil.
2. The remote plasma generator of claim 1, wherein the helical coil is formed of a hollow metal tubing.
3. The remote plasma generator of claim 2, further comprising a pump circulating cooling fluid through the tubing.
4. The remote plasma generator of claim 1, further comprising a cooling jacket surrounding the plasma chamber.
5. The remote plasma generator of claim 4, wherein the helical coil surrounds the cooling jacket.
6. The remote plasma generator of claim 1, wherein the microwave power source generates power at 2450 MHz±50 MHz.
7. The remote plasma generator of claim 1, wherein the helical coil is configured to couple a travelling wave to gas travelling through the plasma chamber.
8. The remote plasma generator of claim 1, wherein the plasma chamber is positioned upstream of a photoresist asher chamber.
9. The remote plasma generator of claim 1, further comprising a microwave shield surrounding the plasma chamber and the helical coil.
10. The remote plasma generator of claim 1, further comprising a microwave absorption load at an output end of the helical coil.
11. The remote plasma generator of claim 1, wherein the coupler comprises a section of coaxial cable.
12. A method of delivering a plasma to a processing chamber, the method comprising:
   providing a source of process gases in fluid communication with a plasma tube, said plasma tube being in fluid communication with a process chamber;
   generating a travelling microwave signal;
   propagating the travelling microwave signal along a microwave conducting structure having a section with a helical shape surrounding the plasma tube;
   flowing a gas through the plasma tube such that a plasma is ignited in the gas; and
   directing products of the plasma into the process chamber.
13. The method of claim 12, further comprising providing a cooling jacket between the helical portion of the microwave conducting structure and the plasma tube and flowing a cooling fluid through the cooling jacket.
14. The method of claim 12, further comprising tuning the microwave signal to a desired wavelength prior to propagating the signal along the microwave conducting structure.
15. The method of claim 12, wherein generating a microwave signal comprises generating a signal with a frequency of about 2450 MHz±50 MHz.
16. The method of claim 12, wherein generating a microwave signal comprises generating a signal with a power of between about 1300 W and about 1500 W.

17. The method of claim 12, wherein the microwave conducting structure comprises a hollow-centered tube, and further comprising pumping a cooling fluid through the microwave conducting structure.

18. The method of claim 17, further comprising isolating the cooling fluid from the microwave signal.

19. The method of claim 12, further comprising a microwave shield surrounding the helical coil and the plasma tube.

20. The method of claim 19, further comprising flowing a cooling gas through a space between the microwave shield and the plasma tube.

21. A method of removing a layer from a substrate, the method comprising:
flowing plasma source gases through a plasma reactor tube;
propagating microwave energy in a travelling wave along a microwave conducting structure having a shape of a slow wave structure and surrounding the plasma reactor tube;
igniting a plasma within the plasma reactor tube; and
flowing plasma products into a process chamber to impinge on a substrate to remove a mask layer on the substrate.

22. The method of claim 21, further comprising flowing a cooling fluid through a conduit adjacent the plasma reactor tube.

23. The method of claim 22, wherein the conduit is a space between a microwave shield and a plasma tube.

24. The method of claim 22, wherein the conduit is a passage through a hollow-centered material of the slow wave structure.

25. The method of claim 22, wherein the conduit is a cooling jacket concentrically surrounding the plasma tube.

26. The method of claim 21, wherein the substrate is a semiconductor wafer.

27. The method of claim 26, wherein the wafer is silicon.

28. The method of claim 27, wherein the layer is a photoresist material.

* * * * *